(12) United States Patent
Hamilton, Jr. et al.

(10) Patent No.: US 6,627,865 B1
(45) Date of Patent: Sep. 30, 2003

(54) NONPLANAR INTEGRATED OPTICAL DEVICE ARRAY STRUCTURE AND A METHOD FOR ITS FABRICATION

(75) Inventors: William J. Hamilton, Jr., Ventura, CA (US); Paul R. Norton, Santa Barbara, CA (US); Eli E. Gordon, Goleta, CA (US); Ronald W. Berry, Goleta, CA (US)

(73) Assignee: Raytheon Company, Lexington, MA (US)

( * ) Notice: Subject to any disclaimer, the term of this patent is extended or adjusted under 35 U.S.C. 154(b) by 113 days.

(21) Appl. No.: 09/859,619

(22) Filed: May 15, 2001

(51) Int. Cl.[7] .......................... H01L 27/00; H01L 31/00
(52) U.S. Cl. ................ 250/208.1; 250/214 R; 250/214.1; 348/374
(58) Field of Search .......................... 250/239, 214 R, 250/214.1, 208.1; 348/374, 294, 493, 340, 373, 375, 376, 482; 359/846, 847, 848, 849

(56) References Cited

U.S. PATENT DOCUMENTS

| | | | | |
|---|---|---|---|---|
| 4,725,890 A | * | 2/1988 | Yaniv et al. | 358/482 |
| 5,957,960 A | * | 9/1999 | Chen et al. | 607/92 |
| 6,285,400 B1 | * | 9/2001 | Hokari | 348/374 |
| 6,332,690 B1 | * | 12/2001 | Murofushi | 362/31 |

* cited by examiner

Primary Examiner—Stephone B Allen
(74) Attorney, Agent, or Firm—William C. Schubert; Glenn H. Lenzen, Jr.

(57) ABSTRACT

An integrated optical device array structure has a plurality of interconnected solid state microelectronic optical device elements associated together on a substrate structure. The optical device elements may be optical detectors or optical emitters. Each optical device element lies on a nonplanar optical array surface. Each optical device element includes an opto-electronic device that interconverts an optical signal and an opto-electronic device electrical signal, and an electrical interface circuit that is in electrical communication with the opto-electronic device electrical signal. The optical device array structure may be fabricated by preparing a flat array of optical device elements and deforming the flat array into the required shape.

20 Claims, 4 Drawing Sheets

NONPLANAR INTEGRATED OPTICAL DEVICE ARRAY STRUCTURE AND A METHOD FOR ITS FABRICATION

This invention was made with government support under contract No. N66001-98-C-8622 awarded by the Department of the Navy. The government has certain rights in this invention.

This invention relates to optical device arrays for sensing or emitting energy and, more particularly, to such optical device arrays that are curved.

BACKGROUND OF THE INVENTION

Many imaging sensor systems utilize an optical system to focus the infrared or visible-light energy of a scene onto a detector array. One widely used detector array is the focal plane array (FPA), in which an array of detector elements is positioned at the focal plane of the optical system. The infrared or visible-light energy focused onto the detector elements is converted to electrical signals. The electrical signals indicative of the image are viewed on a display or processed by a computer, as for example with pattern recognition techniques.

Existing imaging sensor systems with focal plane array detectors are widely used but have limitations in some applications. Illumination falling on the detector and resolution decrease with increasing deviation from the boresight axis of the detector. The imaging sensor systems have technically imposed size restrictions that limit their ability to be reduced in size. Consequently, the imaging sensor systems cannot be used for some tactical applications. Some of the same problems arise with light-emitter arrays such as diode or laser arrays.

There is a need for an improved approach to optical device array structures systems that will improve their optical performance and allow their sizes to be reduced. The present invention fulfills this need, and further provides related advantages.

SUMMARY OF THE INVENTION

The present invention provides an optical device array structure that is curved. In one embodiment, the present invention provides a curved imaging detector array structure that otherwise is structured similarly (but not identically) to a planar array of the FPA type. The curved imaging detector array structure utilizes the microelectronic component structures that are known for use in FPAs, such as monolithic and hybrid arrays, but modifies these structures to be suitable for use in a curved imaging detector array structure. The curved imaging detector array structure achieves improved optical performance with more uniform illumination and improved resolution at large off-axis angles, as compared with a conventional FPA. Additionally, the curved imaging detector array structure allows the imaging sensor system to be built more compactly than possible with a planar imaging detector array. In another embodiment, the present invention provides a curved optical emitter array structure in which the individual elements of the array lie on a curved emitter surface. The curved optical emitter array structure utilizes microelectronic component structures that are otherwise known, such as diodes or lasers, but modifies these structures to be suitable for use in the curved optical emitter array structure. It achieves the same advantages of compactness and better uniformity as does the imaging detector array.

In accordance with the invention, an integrated optical device array structure comprises a plurality of interconnected solid state microelectronic optical device elements associated together on a substrate structure. Each optical device element lies on a nonplanar optical array surface and comprises an opto-electronic device that interconverts an optical signal and an opto-electronic device electrical signal. Typically, each of the opto-electronic devices is substantially planar and lies in an opto-electronic device plane, and the opto-electronic device planes are piecewise tangential to the optical array surface. There may also be an electrical interface circuit that is in electrical communication with the opto-electronic device electrical signal. The opto-electronic device may be a light detector or a light emitter.

In accordance with a specific embodiment of the invention, an integrated imaging detector array structure comprises a plurality of interconnected solid state sensor elements associated together on a substrate. Each sensor element comprises a detector that converts energy incident upon the detector into a detector electrical signal. The detector is typically a semiconductor device. Each detector lies on a nonplanar optical array surface. The detectors and their detector surfaces are preferably each substantially planar in a respective detector plane, and the detector planes are piecewise tangential to the optical array surface.

In one design, each sensor element further includes a readout circuit that receives the detector electrical signal. The detector and the readout circuit may be a monolithic circuit or a hybridized circuit. In these cases, the readout circuit is preferably curved with the same curvature as the optical array surface.

The optical array surface may be singly curved, as in the case of a segment of a cylindrical surface, or doubly curved, as in the case of a segment of a spherical surface. The optical array surface may be regularly curved or complexly curved.

A method for preparing a curved integrated optical device array structure comprises the steps of providing a plurality of interconnected solid state microelectronic optical device elements associated together on a substrate structure, with each optical device element comprising an opto-electronic device that interconverts an optical signal and an opto-electronic device electrical signal. The plurality of optical devices is deformed into a deformed shape such that each opto-electronic device lies on a nonplanar optical array surface. The deformed optical device array structure may be affixed to a curved support to retain the deformed shape. In one embodiment, the method includes the steps, prior to the step of deforming, of providing an electrical interface circuit, and joining the plurality of optical devices to the electrical interface circuit. In an additional step, performed simultaneously with the step of deforming the plurality of optical devices, the electrical interface circuit is deformed into the same deformed shape as the plurality of optical devices.

The use of the curved imaging detector array structure, as distinct from the known focal plane array that is planar, results in the ability to reduce the size and improve the quality of the imaging sensor system. When a focal plane array is placed close to the focusing optics, the image quality is degraded at large off-axis angles in part because the focal plane of the imaging optics does not coincide with the plane of the focal plane array over all angles. The present approach allows the use of lenses in the optical system that produce a curved focal plane, and the curvature of the imaging detector array structure is matched to that curved focal plane. Similarly, a curved optical emitter array structure allows the construction of a smaller and optically more accurate light source or imaging light source.

Optical device array structures differ from other electronic devices and sensors in that their opto-electronic devices (that is, the element that receives or emits light) are pointed in a direction in space that is optimal for receiving (in the case of a detector) or emitting (in the case of an emitter) a light signal. The opto-electronic devices must be structured so that the directional pointing may be achieved with the requisite degrees of freedom, most generally three angular and three translational degrees of freedom. Unless care is taken to ensure that each opto-electronic device is not internally constrained against movement in the required degrees of freedom, the array of opto-electronic devices will distort when it is curved resulting in array defects such as wrinkles, folds, and ripples in the surface of the array. Such defects alter the local pointing direction of individual ones of the opto-electronic devices, and are therefore unacceptable in the present application. For many applications in other types of devices, such as non-directional sensors or electronic devices that do not involve directional pointing, such defects are not unacceptable unless they become so large as to cause a gross distortion and/or failure of the array. The individual opto-electronic devices of the present approach remain piecewise tangential to the optical array surface, and the array is not distorted.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

The preferred embodiment relates to an imaging detector array structure, which will be discussed in relation to FIGS. 1–5. An optical emitter array structure will be discussed in relation to FIG. 6 and modifications to FIG. 5.

Figure 1:
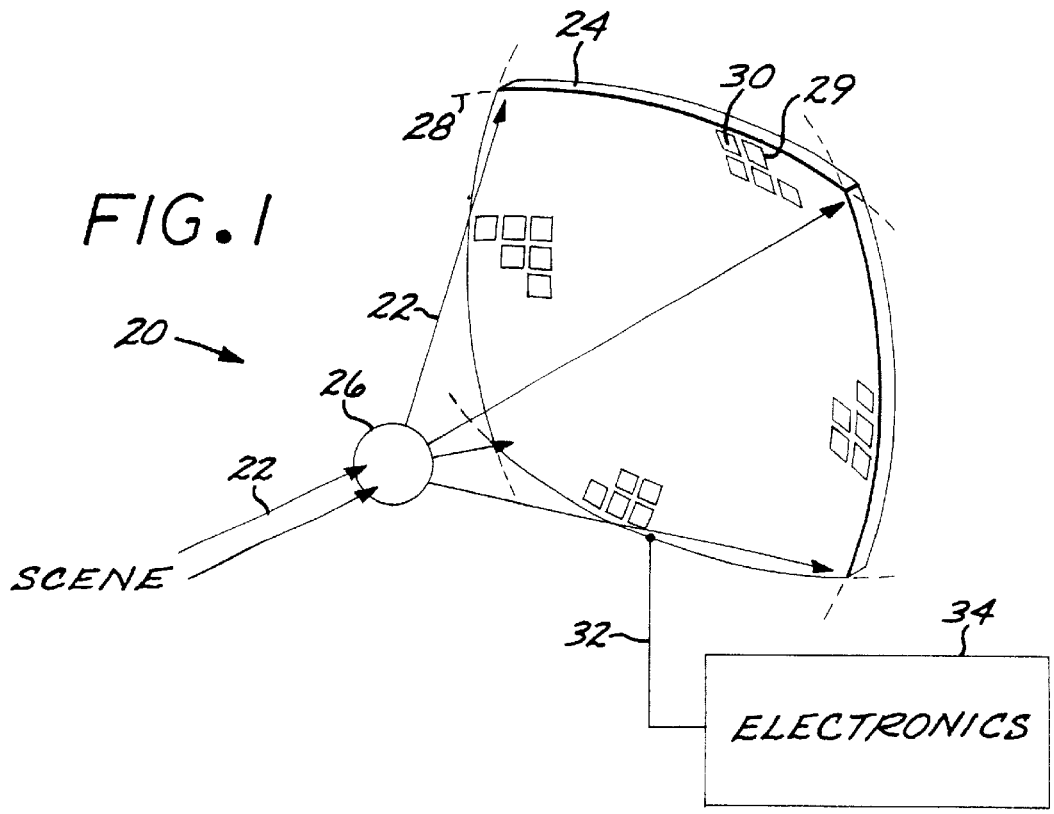
FIG. 1 is a schematic perspective view of an imaging sensor system with a spherical optical array surface.
Figure 2:
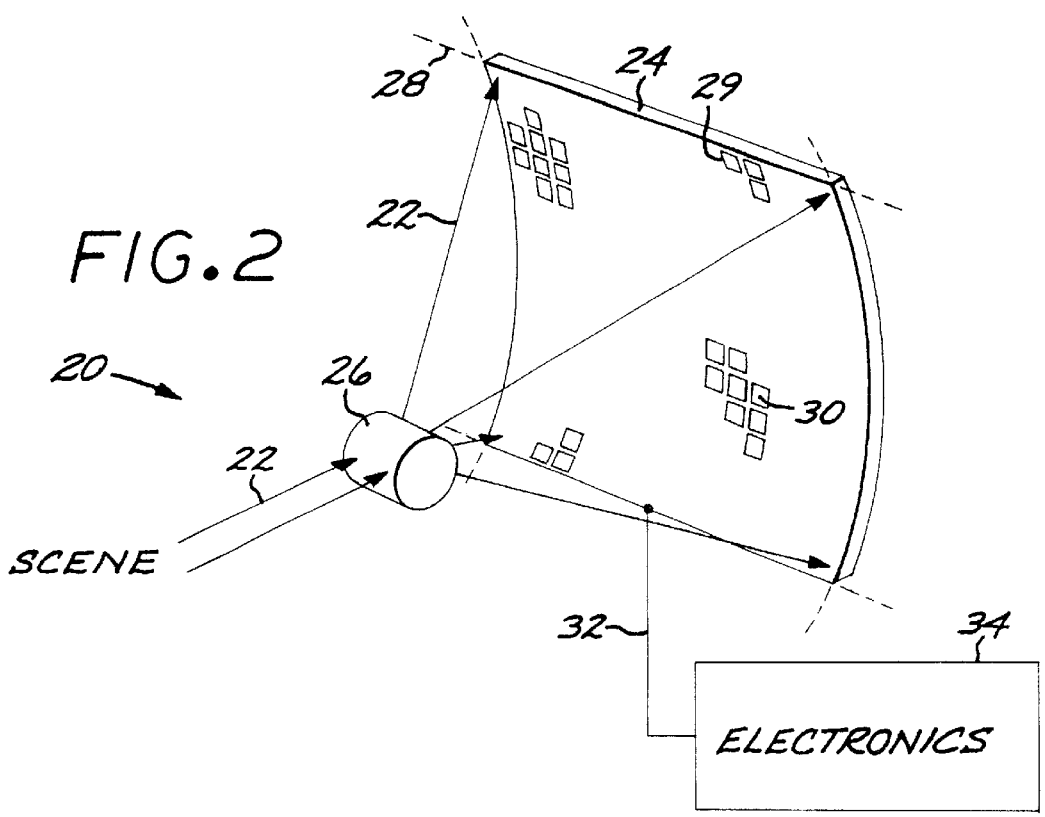
FIG. 2 is a schematic perspective view of an imaging sensor system with a cylindrical optical array surface.

FIGS. 1 and 2 depict imaging sensor systems 20. In each case, rays 22 from a scene are imaged onto a curved imaging detector array structure 24 by an appropriate optical system 26. The detector array structure 26 is made of an array of individual detectors 29. The optical system 26 is represented schematically by a single optical element, but generally it may include multiple optical elements, and both refractive and reflective optical elements. The optical system 26 focuses the rays 22 onto a curved optical array surface 28 (which is a reference surface and not a physical surface). The imaging detector array structure 24 is curved so that the physical detector surfaces 30 of each of the detectors 29 in the detector array lies on the reference surface of the curved optical array surface 28, and is preferably piecewise tangential to the curved optical array surface 28. Each detector surface 30 is substantially planar, defining a respective detector plane, and does not itself follow the curvature of the optical array surface 28. The shape of the optical array surface 28 is closely approximated by curving the array of planar detectors 29 so that some point (preferably the center) of each of the detector surfaces 30 is tangential to the optical array surface 28, a relationship termed "piecewise tangential".

The optical array surface 28, the detector surface 30, and the imaging detector array structure 24 of the embodiment of FIG. 1 are all doubly curved and may be described by curvatures in two dimensions, and in this case are each a segment of a sphere. The optical array surface 28, the detector surface 30, and the imaging detector array structure 24 of the embodiment of FIG. 2 are all singly curved and may be described by a curvature in one dimension, and in this case are each a segment of a cylinder. In these cases of a regularly structured optical device, the center of the radius of curvature is on one side of the optical array surface 28 (here the same side as the optical system 26), ensuring there are no local bumps or ripples in the optical array surface 28. The optical array surface 28 and the detector surface 30 may be more complexly curved. The imaging detector array structure 24 has an electrical output 32 responsive to the local intensity of the portion of the image that falls on the pixels of the imaging detector array structure 24, and this electrical output is provided to analysis electronics 34.

Curved imaging detector array structures 24 have not heretofore been known. Instead, in prior approaches the surface of the detector array was planar. An example is the well known focal plane array (FPA).

Figure 3:
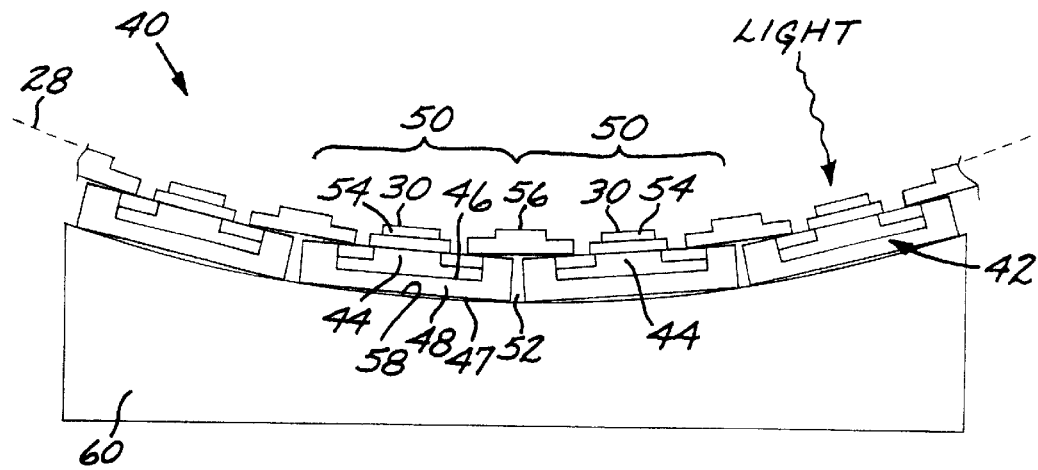
FIG. 3 is a schematic enlarged elevational view of a curved monolithic detector array structure.
Figure 4:
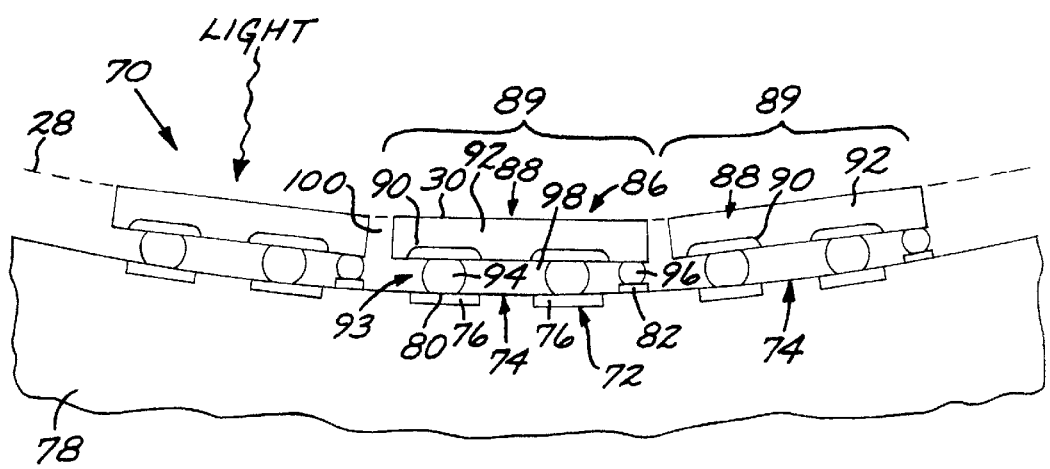
FIG. 4 is a schematic enlarged elevational view of a curved hybrid detector array structure.

There are a number of types of imaging detector array structures 24, two of which are of most interest, a curved monolithic detector array structure 40 shown in FIG. 3 and a hybrid curved detector array structure 70 shown in FIG. 4.

FIG. 3 illustrates the curved monolithic detector array structure 40. The monolithic detector array structure 40 comprises a readout integrated circuit array 42 comprising a first plurality of readout integrated circuit elements 44 each deposited on a front side 46 of a substrate 48. The readout integrated circuit elements 44 are electrical interface circuits that are in electrical communication with the opto-electronic device electrical signal produced by the detector elements discussed subsequently. The substrate 48 has an oppositely disposed back side 47. The readout integrated circuit elements 44 are microelectronic circuits that amplify and condition the electrical outputs of their respective detectors (to be discussed subsequently). Such readout integrated circuit elements 44 are known in the art, except for the improvements and modifications set forth herein.

The substrates 48 are physically discontinuous so that each substrate 48 is a substrate island 50 which is physically separated from the other substrate islands 50 with a gap 52 therebetween. There may be exactly one readout integrated circuit element 44 formed on each substrate island 50, as illustrated in FIG. 3, or there may be more than one readout integrated circuit element 44 formed on each substrate island 50. This physical discontinuity of the substrates 48 is an important feature of the invention. A monolithic detector array structure with a single physically continuous substrate is known in the art, but it lacks the advantages of the discontinuous substrates 48. The substrates 48 are typically made of a relatively inflexible material, such as a piece of silicon, and the physical separation allows the array of substrates to flex and curve as desired.

The monolithic detector array structure 40 also has a first plurality of detector elements 54 (i.e., the detectors 29 of FIGS. 1–2) with a respective detector element 54 associated with and directly connected to each of the readout integrated circuit elements 44. The detector elements 54 are opto-electronic devices that internally interconvert from an optical signal to an opto-electronic device electrical signal. In one embodiment used to detect infrared energy, the detector elements 54 are microbolometers which produce an electrical output signal responsive to slight changes in heat when infrared energy impinges upon the microbolometer. A typical microbolometer structure is a freestanding bridge of $Si_3N_4$, $VO_x$, and $Si_3N_4$ layers.

Except for the modifications and improvements discussed herein, microbolometer-based detectors and their readout circuits are known in the art. See, for example, U.S. Pat. Nos. RE36706; RE36136; 5,534,111; 6,144,030; 6,201,243; 5,010251; 5,021663; 5,288,649; 5,399,897; and 5,831,266, all of whose disclosures are incorporated herein in their entireties.

A second plurality of electrically conductive interconnects 56 extends between the readout integrated circuit elements 54 of adjacent substrate islands 50. These electrically conductive interconnects 56 are typically formed of metal such as aluminum, copper, or gold. They conduct signals such as bias and clocking signals to the readout integrated circuit elements 44, and output signals from the readout integrated circuit elements 44.

The electrically conductive interconnects 56 are preferably structurally flexible. As used herein, "structurally flexible" means that the electrically conductive interconnect has a structure that allows it to flex more readily than would be possible from a rectangular piece of the material of the same general size. The interconnect is made of a metal that may stretch elastically and plastically as well as mechanically flex. Two forms of structurally flexible electrically conductive interconnects 56 are of particular interest. In one, the interconnects 56 are partially serpentine perpendicular to the plane of the page in FIG. 3, and in the other the interconnects 56 are partially serpentine in a plane locally tangent to the detector surface 30.

The structural flexibility of the electrically conductive interconnects 56 allows the detector elements 54 to move in the requisite degrees of freedom, so that they remain piecewise tangential to the optical array surface 28. If the electrically conductive interconnects 56 are rigid in the sense that they do not permit the movement in the requisite degrees of freedom, the array of detector elements 54 cannot bend to the necessary curvature in one or two dimensions of flexure and array defects such as ripples, wrinkles, and folds result.

In the illustrated embodiment, the back side 47 of the curved monolithic detector array structure 40 is affixed to a curved face 58 of a support 60. The affixing is achieved by any operable approach, such as an adhesive. The curved face 58 has the same curvature as the optical array surface 28. The support 60 may be relatively massive to hold the curved monolithic detector array structure 40 in the proper curvature. Alternatively, in this embodiment and the other embodiments discussed herein, the support 60 may be flexible so that its shape may be dynamically controlled.

The dimensions of the monolithic detector array structure 50 are not critical. In a typical case, however, the readout integrated circuit elements 44 are in a square array spaced about 50 micrometers center-to-center along the sides of the square. The square detector islands 50, which each have multiple detector elements 34 and readout integrated circuit elements 44, are about 400 micrometers on a side. The gap 52 between the detector islands 50 is preferably small, typically about 10–20 micrometers wide. The detector elements 54 are about 0.20–0.5 micrometers thick, and the substrates 48 are about 50–75 micrometers thick.

In the curved monolithic detector array structure 50, the substrates 48 are preferably segmented so that they may be deformed to the curvature of the optical array surface 28. The detector elements 54 are separated from each other by their nature, but in a conventional monolithic detector array structure the interconnects 56 are rigid. In the present approach, the interconnects 56 are made structurally flexible and extensible. Thus, the monolithic detector array structure 50 of the invention may be deformed to the desired curved shape because of the separated island structure of the substrates and the structurally flexible interconnects.

FIG. 4 depicts the curved hybrid detector array structure 70. The discussion of FIG. 4 incorporates many of the same concepts discussed above, and the prior discussion is incorporated to the extent applicable. The hybrid detector array structure 70 comprises a readout integrated circuit array 72 including an array of readout integrated circuits (ROICs) 74. The readout integrated circuits 74 are electrical interface circuits that are in electrical communication with the opto-electronic device electrical signal produced by the detector elements discussed subsequently. Each one of the readout integrated circuits 74 has a microelectronic circuit region 76 supported on a common ROIC substrate 78. On each of the readout integrated circuits 74 there is a first detector interconnect location 80. A common second detector interconnect trace 82 is provided for each island structure.

The hybrid detector array structure 70 further includes a detector array 86 comprising an array of individual detector elements 88 arranged as detector islands 89. The detector elements 88 are opto-electronic devices that internally interconvert from an optical signal to an opto-electronic device electrical signal. (FIG. 4 illustrates the case where there is more than one detector element 88 per detector island 89, but there may be exactly one detector element 88 per detector island 89 in other embodiments.) There is a respective detector element 88 for each of the readout integrated circuits 74. Each respective pair of detector element 88 and readout integrated circuit 74 defines a unit cell or pixel of the curved hybrid detector array structure 70. Each one of the detector elements 88 comprises a first semiconductor region 90 and a second semiconductor region 92. In a preferred case the first semiconductor region 90 of each one of the detector islands 89 is a p-doped semiconductor, and the second semiconductor region 92 of each one of the detector islands 89 is an n-doped semiconductor.

The first semiconductor region 90 of each one of the detector islands 89 is physically discontinuous from the first semiconductor region 90 of each of the other detector islands 89. The second semiconductor region 92 of each one of the detector islands 89 is physically discontinuous from the second semiconductor region 92 of each of the other detector islands. Each one of the detector islands 89 is electrically isolated from each of the other detector islands except through the readout integrated circuit array 72.

An interconnect structure 93 extends between each one of the readout integrated circuits 74 and its respective detector element 88. The interconnect structure 93 is of any operable type, but is preferably a bump interconnect structure. Each such bump interconnect structure 93 comprises a first bump interconnect 94 extending from the first detector interconnect location 80 of each one of the readout integrated circuits 74 to the first semiconductor region 90 of its respective detector element 88. A common second bump interconnect 96 extends from the trace to the second semiconductor region 92 of each of the detector islands 89. The first bump interconnect 94 and the second bump interconnect 96 each preferably are made of the element indium (including indium and indium alloys). The use of bump interconnects is well known in the art in other contexts.

The semiconductor regions 90 and 92 are supported from their respective readout integrated circuits 74 by the bump interconnects 94 and 96. Optionally, to increase the mechanical stability of the detector elements 88, an electrically nonconducting support material 98 may be present between the readout integrated circuit array 72 and the detector array 86. This electrically nonconducting support material 98 is typically a soft material such a soft epoxy or latex polymer or a wax that provides lateral stability to the bump interconnects 94 and 96 but does not transmit substantial shear forces that arise from differences in thermal expansion coefficient between the detector array 86 and the readout integrated circuit 74. The electrically nonconducting support material 98 may be provided during processing, and then may be left in place or, preferably, removed at a later time prior to service. The electrically nonconducting support material 98 provides lateral support for the detector elements 88 but does not transmit substantial stresses that might otherwise build up between the detector elements.

Thus, the detector islands 89 are mechanically not connected together except through the interconnect structure 93 to the readout interconnect array 72 and through the optional support material 98, which does not carry or support any substantial load. The individual detector islands 89 are therefore free to move in the requisite degrees of freedom, six degrees of freedom in the most general case of a two-dimensional curvature. As seen in FIG. 4, there is a gap 100 between each of the detector islands 89, so that the detector array 86 may bend to conform to the optical array surface 28 without experiencing defects such as wrinkles, folds, and ripples.

The detector array 86 is also resistant to the buildup of thermal stresses during thermal cycling between ambient temperature and the cryogenic service temperature. The detector islands 89 are not electrically connected together directly through either of the regions 90 and 92. Electrical cross talk between the different detector islands 89 is thereby avoided. Electrical current flows though the interconnection trace 82 may be readily controlled by the switches (not shown) in the readouts of the peripheral unit cell.

The readout integrated circuit 74 is preferably a silicon-based integrated circuit for optimal cryogenic electrical performance. The detector element 88 is of any operable type, but is preferably a type such as p-doped/n-doped mercury-cadmium-telluride diode, p-doped/n-doped indium antimonide diode, quantum well infrared photodetector (QWIP), or extrinsic impurity band conductor (IBC) material in silicon or germanium.

Figure 5:
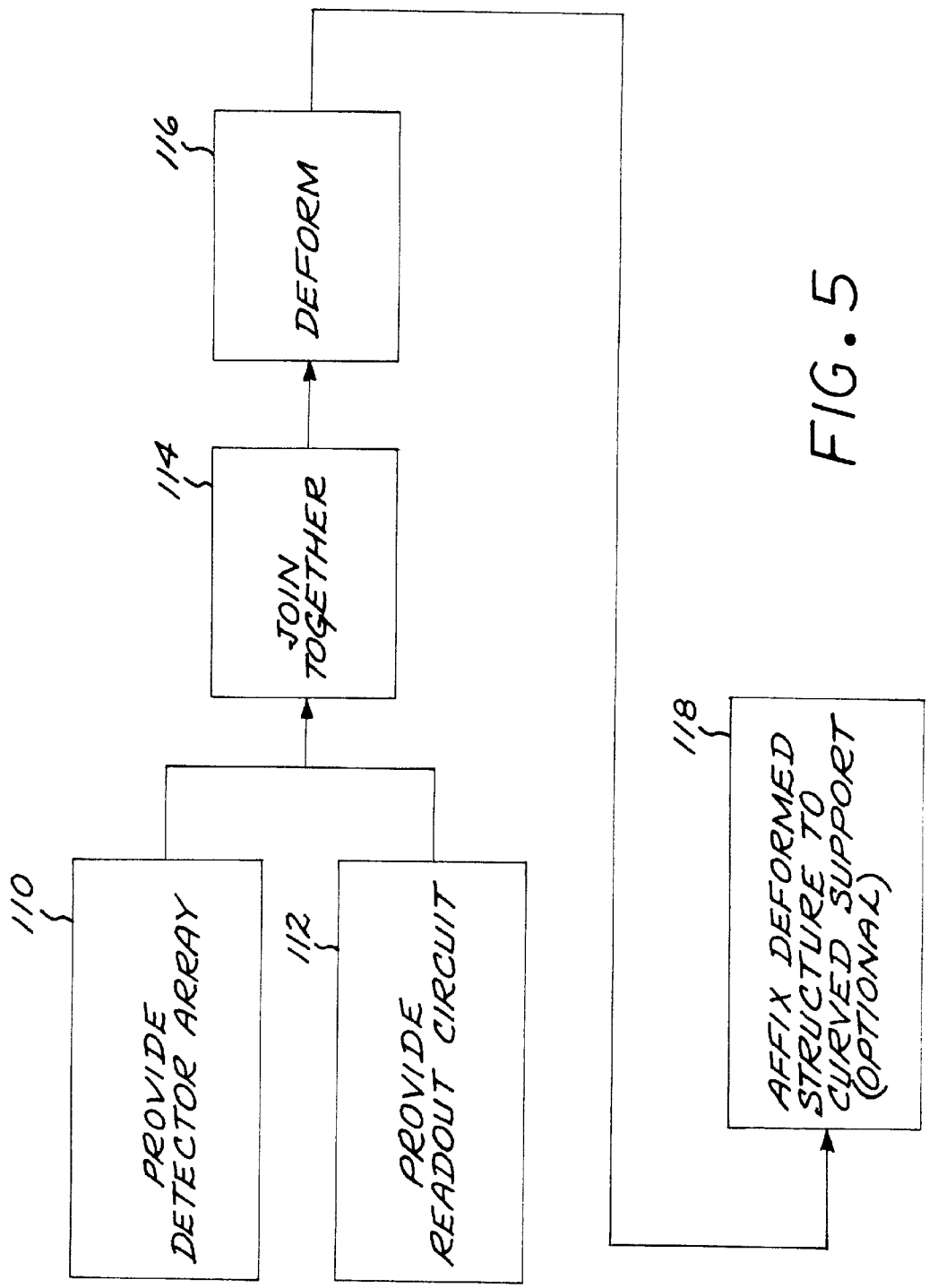
FIG. 5 is a block flow diagram of an approach for preparing the imaging detector array structure.

FIG. 5 depicts an approach for preparing the curved integrated imaging detector array structure 24. A detector array is fabricated and provided, numeral 110. The detector array has any operable structure, but is preferably of the form described in relation to FIG. 3 or FIG. 4. A readout circuit compatible with the selected detector array is fabricated and provided, numeral 112. The detector array and the readout circuit are provided with the features described above, such as island structures and structurally flexible interconnects, that enhance their ability to be deformed.

The detector array and the readout circuit are joined together using the approach described above for each embodiment, numeral 114. The detector array and the readout circuit are thereafter deformed into the desired curvature as required to conform to the optical array surface 28, numeral 116. The surfaces of the islands 50 and 89 are substantially planar, but are angularly displaced from each other so that they closely lie along the optical array surface 28 and are preferably piecewise tangential to the optical array surface 28. The deforming is preferably accomplished with a mechanical pressure, such as a differential gas pressure. Preferably, the deforming 116 is accomplished with a gas pressure applied to the concave side of the deforming structure or a vacuum applied to the convex side of the deforming structure. The steps 114 and 116 are preferably practiced in the described order, joining followed by deforming. However, their order may be reversed or sub-steps intermixed in some instances, with the deforming of the individual components being followed by joining the deformed components, for example.

As noted above, in most instances the deformed structure of the joined detector array and the readout circuit do not retain the desired shape of the optical array surface 28 after the deforming force is removed. It is therefore the preferred practice to join the deformed structure to the curved support 60, numeral 118, as depicted for the embodiment of FIG. 3.

The present approach has been reduced to practice for both the curved monolithic detector array structure and the curved hybrid detector array structure.

Figure 6:
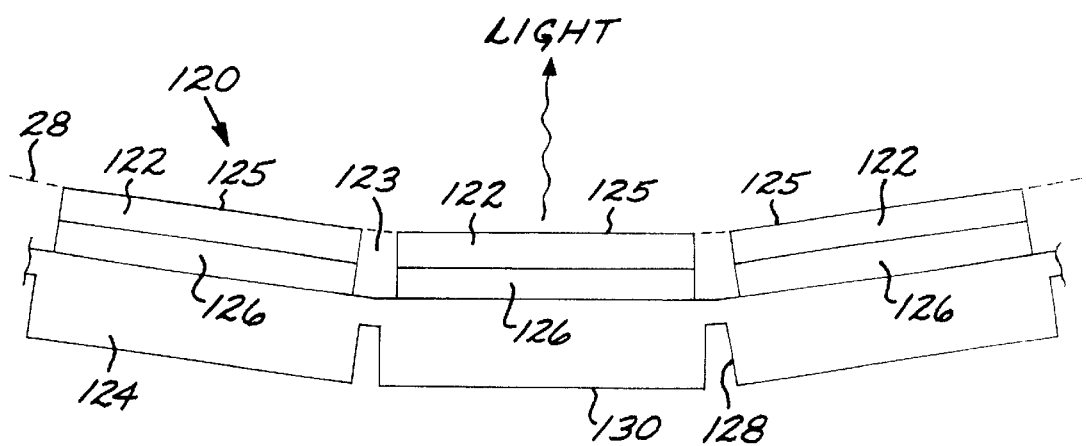
FIG. 6 is a schematic elevational view of an optical emitter array structure.

FIG. 6 schematically depicts an integrated optical device array structure 120 formed of a plurality of interconnected solid state microelectronic optical emitters 122 associated together on a substrate structure 124. The optical emitters 122 are opto-electronic devices that produce an optical output signal responsive to an opto-electronic device electrical signal. Examples of operable optical emitters 122 include light-emitting diodes and laser emitters such as laser diodes. Such optical emitters 122 are known in the art for other applications, and particularly for planar structures. Some aspects of the prior discussion are appropriate to the discussion of this structure 120, and this prior discussion is incorporated here to the extent applicable. Likewise, the present discussion is incorporated into the earlier discussion to the extent applicable. Each of the optical emitters 122 lies on the nonplanar optical array surface 28 and is piecewise tangential to the optical array surface 28. A gap 123 between the optical emitters 122 permits the array of optical emitters 122 to flex so that their surfaces 125 lie on the optical array surface 28 and are preferentially piecewise tangential thereto.

A compatible electrical driver circuit 126 is provided for each of the optical emitters 122, and compatible electrical driver circuits 126 and their respective optical emitters 122 are known in the art. The electrical driver circuit 126 outputs the opto-electronic device electrical signal to the optical emitter 122 and thence is in electrical communication with the optical emitter 122. In some cases there may be an electrical driver circuit 126 for each of the optical emitters 122. In other cases, a single electric driver circuit 126 may supply the opto-electronic device electrical signal for more than one of the optical emitters 122, up and including all of the optical emitters 122 being driven by a single electrical driver circuit 126. The optical emitters 122 are supported on the electrical driver circuits 126, which are in turn supported on the substrate 124. External electrical interconnects are also present but are outside of the view of FIG. 6.

The substrate 124 is curved to allow the optical emitters 122 to lie on the optical array surface 28. The curvature of the substrate may be accomplished by bending of the full-thickness substrate as in FIGS. 3 and 4. Alternatively, the substrate 124 may be trenched, typically by directional reactive ion etching, to provide trenches 128 extending into the substrate 124 from a back side 130 remote from the optical emitters 122. The trenches 128 allow the substrate 124 to bend more readily so that the optical emitters 122 may bend to the shape of the optical array surface 28. This same trenching approach may be applied to the embodiments of FIGS. 3 and 4 if desired.

The substrate 124 may be joined to a support in the manner illustrated in FIG. 3. The substrate 124 may instead be actively flexed by a flexure mechanism that is not illustrated to alter the optical figure of the structure. Some examples of flexure mechanisms for the substrate 124 include bladders, piezoelectric devices, and bimetallic devices. That is, the pointing direction of the light output of each of the optical emitters 122 of the integrated optical device array structure 120 may be actively controlled by controllably flexing the substrate 124 to locally change the shape of the optical array surface 28. The same active flexure principle may be applied to the detector devices of FIGS. 3 and 4, to permit their detector pixels to be selectively aimed.

The integrated optical device array structure 120 may be fabricated by the approach of FIG. 5, except that the step 110 is replaced by a step of providing the optical emitters 122, and the step 112 is replaced by a step of providing the driver circuits 126.

The preceding discussion has focused on the fabrication of the integrated optical device array structure generally by deposition on a planar surface and then bending the deposited structure to the required curvature of the optical array surface 28. In another approach, the integrated optical device array structure may be deposited directly onto a curved surface of the required shape. This alternative approach may be used with any of the embodiments discussed herein.

Figure 7:
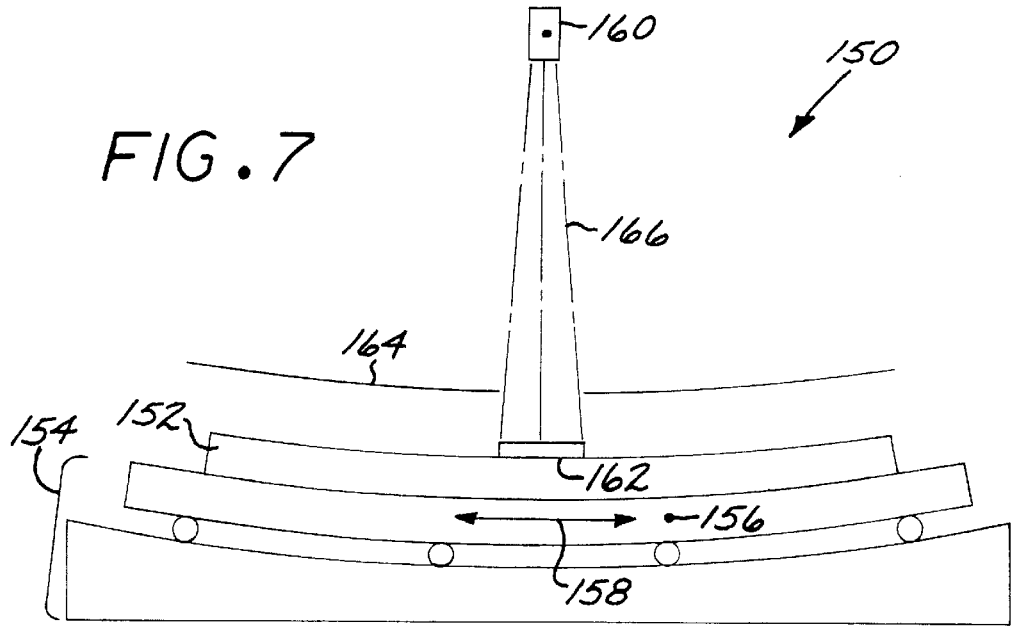
FIG. 7 is a schematic elevational view of a deposition apparatus for direct deposition on a curved substrate.

FIG. 7 schematically depicts an apparatus 150 for depositing the integrated optical device array structure on a curved substrate 152. The substrate 152 is mounted to a movable base 154 that controllably moves the substrate 152 laterally or in an arc as required. The movable base 154 provides linear translation, in the illustration in a direction 156 out of the plane of the page, and/or translation in an arc, in the illustration in a direction 158 lying in the plane of the page. This particular apparatus 150 is suitable for depositing the integrated optical device array structure with a one-dimensional, cylindrical curvature. Alternatively, the apparatus may provide radial and circumferential (r, θ) translations for depositing the integrated optical device array structure with a two-dimensional, spherical curvature. Other translations may be provided as appropriate for other curvatures.

A deposition source 160 deposits semiconductor layers or other structures 162 onto the surface. These structures 162 are the optical device elements discussed earlier for the various embodiments. FIG. 7 shows only a single deposition source 160, but typically there would be a number of deposition sources used serially or concurrently as needed, for the different compositions required for the various portions of the structures 162. The selection of the source(s) is made responsive to the type of material to be deposited and is known in the art for each such material. The deposition source 160 may deposit onto the entire substrate 152 at once, or only onto a limited portion of the substrate 152 through a deposition mask 164. The use of the deposition mask 164 ensures that the orientation of the deposition beam 166 to the substrate 152 will always be the same for all regions of the substrate 152.

At the present time, the approach of depositing the components onto a planar substrate and then bending the structure is preferred to that of FIG. 7, because this approach allows the electronic structure to be fabricated by a known, proved deposition technique that achieves the desired crystallographic relationships.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An integrated optical device array structure comprising a plurality of interconnected solid state microelectronic optical device elements associated together on a substrate structure, each optical device element lying on a nonplanar optical array surface and comprising
    an opto-electronic device that interconverts an optical signal and an opto-electronic device electrical signal, and
    an electrical interface circuit that is in electrical communication with the opto-electronic device electrical signal, wherein the opto-electronic device and the electrical interface circuit together comprise a hybridized circuit.

2. The integrated optical device array structure of claim 1, wherein
    the opto-electronic device is an optical detector that receives the optical signal as an input and outputs the opto-electronic device electrical signal, and wherein
    the electrical interface circuit is a readout integrated circuit that receives the opto-electronic device electrical signal as an input.

3. The integrated optical device array structure of claim 1, wherein
    the opto-electronic device is an optical emitter that receives the opto-electronic device electrical signal as an input and outputs the optical signal, and wherein
    the electrical interface circuit is an electrical driver circuit that outputs the opto-electronic device electrical signal.

4. The integrated optical device array structure of claim 1, wherein each of the opto-electronic devices is substantially planar and lies in an opto-electronic device plane, and wherein the opto-electronic device planes are piecewise tangential to the optical array surface.

5. The integrated optical device array structure of claim 1, wherein the optical array surface is singly curved.

6. The integrated optical device array structure of claim 1, wherein the optical array surface is doubly curved.

7. An integrated optical device array structure comprising a plurality of interconnected solid state microelectronic optical device elements associated together on a substrate structure, each optical device element lying on a nonplanar optical array surface and comprising
    an opto-electronic device that interconverts an optical signal and an opto-electronic device electrical signal, wherein each of the opto-electronic devices is substantially planar and lies in an opto-electronic device plane, and wherein the opto-electronic device planes are piecewise tangential to the optical array surface and an electrical interface circuit that is in electrical communication with the opto-electronic device electrical signal, wherein the opto-electronic device and the electrical interface circuit together comprise a monolithic circuit.

8. An integrated optical device away structure comprising a plurality of interconnected solid state microelectronic sensor elements associated together on a substrate structure, each sensor element comprising a detector that lies on an optical array surface and converts optical energy incident upon the detector into a detector electrical signal, wherein the detectors are each substantially planar and lie in a detector plane, and wherein the detector planes are piecewise tangential to the optical array surface, and a readout circuit that receives the detector electrical signal and outputs a readout electrical signal, wherein the optical array surface is nonplanar.

9. The integrated optical device array structure of claim 8, wherein the detector and the readout circuit together comprise a monolithic circuit.

10. The integrated optical device array structure of claim 8, wherein the detector and the readout circuit together comprise a hybridized circuit.

11. The integrated optical device array structure of claim 8, wherein the optical array surface is singly curved.

12. The integrated optical device array structure of claim 8, wherein the optical array surface is doubly curved.

13. The integrated optical device array structure of claim 8, wherein at least one of the detector and the readout circuit is part of a segmented island structure.

14. An integrated optical device array structure comprising a plurality of interconnected solid state microelectronic optical device elements, each optical device element lying on a nonplanar optical array surface and comprising an opto-electronic device that interconverts an optical signal and an opto-electronic device electrical signal; and a non-flexible support having a curved face to which the opto-electronic devices are fixed, wherein the relatively massive support holds the opto-electronic devices in a curvature defined by the curved face of the support.

15. The integrated optical device array structure of claim 14, wherein the opto-electronic devices are each substantially planar and lie in an opto-electronic device plane, and wherein the opto-electronic device planes are piecewise tangential to the optical array surface.

16. The integrated optical device array structure of claim 14, wherein each optical device element further includes an electrical interface circuit that is in electrical communication with the opto-electronic device electrical signal.

17. The integrated optical device array structure of claim 14, wherein the opto-electronic device is a light detector.

18. The integrated optical device array structure of claim 14, wherein the opto-electronic device is a light emitter.

19. The integrated optical device array structure of claim 14, wherein the optical device element further comprises an electrical interface circuit that is in electrical communication with the opto-electronic device electrical signal, and wherein the opto-electronic device and the electrical interface circuit together comprise a monolithic circuit.

20. The integrated optical device array structure of claim 14, wherein the optical device element further comprises an electrical interface circuit that is in electrical communication with the opto-electronic device electrical signal, and wherein the opto-electronic device and the electrical interface circuit together comprise a hybridized circuit.

* * * * *